United States Patent [19]

Sashital

[11] Patent Number: 4,589,737
[45] Date of Patent: May 20, 1986

[54] DOPED AND UNDOPED SINGLE CRYSTAL MULTILAYERED STRUCTURES

[75] Inventor: Sanat K. Sashital, Thousand Oaks, Calif.

[73] Assignee: Hughes Aircraft Company, Los Angeles, Calif.

[21] Appl. No.: 605,736

[22] Filed: May 1, 1984

[51] Int. Cl.$^4$ .............................................. G02F 1/03
[52] U.S. Cl. .................................... 350/356; 156/605; 156/622; 156/624; 350/400
[58] Field of Search ........................ 156/605, 622, 624; 350/400, 403, 404, 356

[56] References Cited

U.S. PATENT DOCUMENTS

| | | | |
|---|---|---|---|
| 3,345,141 | 10/1967 | Nester et al. | 156/624 |
| 4,001,076 | 1/1977 | Robinson et al. | 156/624 |
| 4,229,073 | 10/1980 | Lotspeich | 350/404 X |
| 4,247,166 | 1/1981 | Yeh | 350/400 X |
| 4,500,178 | 2/1985 | Yeh | 350/400 X |
| 4,534,822 | 8/1985 | Sashital | 156/624 |

Primary Examiner—Bruce Y. Arnold
Attorney, Agent, or Firm—John A. Sarjeant; A. W. Karambelas

[57] ABSTRACT

Disclosed is a multilayer electro-optical material having a plurality of adjacent, single crystals wherein each crystal layer has different electrical and optical properties from its adjacent layer or layers. This material is made by a method wherein the successive layers are epitaxially grown from a molten solution of said electro-optical material optionally containing at least one dopant. In one embodiment, such electro-optic material comprises silver thiogallate, wherein successive epitaxial layers are grown from a molten solution of silver thiogallate and potassium chloride, and which optionally includes at least one dopant. This molten solution exhibits the characteristic that, for any specific solution composition, layers having different electrical and optical properties can be obtained by cooling over the temperature range which will yield crystal growth of the composition corresponding to the desired electrical and optical properties. By taking advantage of this temperature/composition phase precipitation, multi-layers are formed by cooling first within one temperature range to form on the seed crystal substrate a layer of silver thiogallate including the dopant and then subsequently forming on this first layer a second layer of different composition varying from substantially pure silver thiogallate to silver thiogallate including at least one dopant, by cooling within a different temperature range. By successively alternating between cooling over these different temperature ranges, multiple layers are formed with adjacent layers having different electrical and optical properties. The multi-layerd structures produced by the above method can be utilized in electro-optical devices, and particularly as the tunable birefringent medium in tunable electro-optic filters.

24 Claims, 2 Drawing Figures

DOPED AND UNDOPED SINGLE CRYSTAL MULTILAYERED STRUCTURES

RIGHTS OF THE UNITED STATES GOVERNMENT

The Government has rights in this invention pursuant to Contract No. F04701-82C-009, awarded by the Department of the Air Force.

BACKGROUND OF THE INVENTION

1. Field of the Invention

This invention relates to crystalline material for use in electro-optic devices and particularly to such material formed by epitaxially growing successive layers of silver thiogallate crystals from a solution including a dopant to form layers having different resistivities.

2. Description of the Prior Art

Certain electro-optic tunable filters, modulators, switches, shutters, and resonators are electronically tunable. In order to make an electronically tunable device, such as a tunable optic filter, a spatially varying dc electric field is applied to successive regions of a birefringent crystalline medium disposed between a pair of suitably oriented polarizers along the path of a light beam to be filtered. The dc electric field may be either parallel or perpendicular to the light path. This field electro-optically produces in the birefringent medium an effective oscillation of the optic axis of the medium about the pass direction of the input polarizer. The oscillation is in a plane perpendicular to the light path as a function of distance along the light path, with a predetermined spatial variation to achieve a desired filter transmission characteristic.

The potential use of silver thiogallate ($AgGaS_2$) in tunable filters and other elecro-optical devices is described by Gopal C. Bhar and R. C. Smith in an article "Silver Thiogallate ($AgGaS_2$) - Part II: Linear Optical Properties, *IEEE Journal of Quantum Electronics*, Vol. QE-10, No. 7 (July 1974) pp. 546–550. In this article, it is pointed out that the remaining problems, which have prevented utilization of $AgGaS_2$ in infrared nonlinear optical devices, are primarily in the area of development of crystal growth methods which would provide a crystal free from twinning defects and residual absorption due to scattering from second phase precipitates.

Many of the devices in which use of the $AgGaS_2$ crystal would be most advantageous require multiple layers of crystal, with each layer varying in composition so that the entire structure can be tuned electronically to provide the desired elecro-optical characteristics. This has been accomplished using a number of individual layers of single crystal plates bonded together into a stack arrangement as described in U.S. Pat. No. 4,197,008, "Electro-Optic Tunable Optical Filter", U.S. Pat. No. 4,229,073 "Iso-Index Coupled-Wave Electro-Optic Filters", U.S. Pat. No. 4,350,413, "Multi-Color Tunable Filter", and U.S. Pat. No. 4,240,696, "Multilayer Electro-Optically Tunable Filter". Further details concerning use of semiconductor crystals in such devices may be found in J. P. Laurenti et al, "Optical Filters Using Coupled Light Waves in Mixed Crystals", *Applied Physics Letters*, Vol. 28, No. 4 (Feb. 15, 1976) pp. 212–213 and J. P. Laurenti et al, "Graded-Composition Semiconductors as Tunable Narrow-Band Optical Filters", *Journal of Applied Physics*, Vol. 48, No. 1 (January 1977) pp. 203–204.

However, the bonding of a number of individual layers results in handling and assembly problems encountered when thin layers of crystal are sliced from the bulk-grown crystals and polished and bonded together to form the multiple layer structures.

U.S. Pat. No. 4,535,822, which issued as a patent on Aug. 13, 1985, by S. R. Sashital entitled, "A Method of Synthesizing Highly Pure, Thin, Single Crystal of Silver Thiogallate", filed on the same date as this application, discusses the use of silver thiogallate as a suitable crystal material for electro-optic devices. Herein this patent application will be referred to as the Sashital I Application. In the Sashital I Application there is disclosed a method of synthesizing a single crystal layer of silver thiogallate by growing it epitaxially on a seed crystal from a molten solution of silver thiogallate in either antimony sulfide or lead sulfide. This crystal layer alone, however, is not suitable for the electrical optic device of the type discussed herein.

U.S. Pat. No. 4,540,461, which issued as a patent on Sept. 10, 1985, by S. R. Sashital, R. L. Joyce, and A. L. Gentile, entitled, "Silver Thiogallate Single Crystal Epitaxial Grown from Potassium Chloride-Silver Thiogallate Solution", filed the same day as this application, discloses an improvement in the method of the Sashital I Application. Herein this patent application of Sashital et al will be referred to as the Sashital II Application. In this Sashital II Application there is disclosed the use of potassium chloride as a solvent for the silver thiogallate, replacing the antimony sulfide or lead sulfide. According to the invention of the Sashital II Application, a single crystal layer of silver thiogallate is grown on a seed crystal substrate of, preferably, silver thiogallate crystal. First, a molten solution of silver thiogallate and potassium chloride is prepared and then the seed crystal substrate is dipped into this molten solution and the solution's temperature slowly lowered. The reduction in temperature forms on the seed crystal substrate the layer of single crystal silver thiogallate. The problem nevertheless remains of producing a multilayered material comprising layers of single crystals bonded together and having a conducting member with a suitably matched refractive index disposed between adjacent crystal layers which does not degrade the light signal passing through the device. The present invention overcomes this problem.

SUMMARY OF THE INVENTION

In accordance with the invention, a method is provided for making a multi-layered crystalline material which allows a light signal to pass through it without substantial degradation of the signal. This material has a plurality of adjacent, single crystal layers of essentially the same electro-optic material except that different layers may include a dopant or dopants which substantially alter each layer's resistivity. Specifically, for an electro-optic tunable filter, the adjacent single crystal layers are of essentially the same electro-optic material except that alternate layers may include a dopant or dopants which substantially lowers this layer's resistivity.

The method of the invention exploits the phenomenon whereby a mixture of a solute and solvent with dopant in it will, over one temperature range, precipitate from the solution solute with traces of dopant or dopants in it and, at another temperature range, precipitate the solute and the dopant as separate, mutually insoluble phases. This phenomenon is termed herein "temperature/composition-dependent phase precipitation". By correctly selecting the suitable temperature for a given mixture of solute, solvent and dopant, multi-layered material may be made which comprises a plurality of adjacent, single crystals wherein alternate layers have substantially different resistivities. For example, one layer may have a resistivity in the range of about $10^{12}$ to $10^{14}$ ohm-cm and the layer adjacent to it may have a resistivity in the range of about $10^5$ to $10^9$ ohm-cm. In one embodiment of this invention, a silver thiogallate/potassium chloride/germanium system is disclosed, with germanium as the dopant.

As taught in the Sashital II Application, a seed crystal is first dipped into the molten solution and then the solution is slowly cooled. According to the method of this invention, at least two cooling steps are utilized over at least two different temperature ranges. For example, the doped crystal epitaxial layer may be formed first on the seed crystal over a first temperature range as described above. At this point, the substrate with doped crystal layer upon it is then removed from the molten solution. The solution is then adjusted to a second temperature range over which an epitaxially grown layer will be substantially dopant free, and the crystal/substrate is then reimmersed into the solution. Upon further cooling, there forms on the first layer, a second layer substantially free of dopant. The two steps may be repeated as often as necessary to build up a desired structure of alternating high resistivity and low resistivity layers. The multi-layer crystal/substrate is then removed and washed. This multi-layered crystalline material may now be fabricated into the core element of an electrooptic device such as a tunable filter in accordance with conventional techniques.

The advantages of this invention are many fold. First, and primarily, a multi-layered crystalline material is provided by a very simple process which produces adjacent layers of essentially the same material except one layer is doped so that it has a substantially lower resistivity than the layer adjacent to it. This is accomplished by the simple step of modifying temperature conditions while growing epitaxially the crystal layers from a molten solution. Secondly, the method, although specifically disclosed in connection with silver thiogallate, may be used to form other crystalline materials. The application of this method will depend upon the particular properties of the crystal material and the solvents for this material. Thirdly, the material made by the method of this invention will have crystal layers in intimate contact and firmly bonded to each other since the different layers are of compatible material, being essentially the same except for the absence or presence of the dopant. Fourthly, because only material exhibiting electrical and optical properties is employed, the device of this invention will have improved performance, e.g., losses due to light absorption will be reduced. Thus, such multilayer structures are particularly advantageous for use in devices such as tunable electrooptic filters.

DETAILED DESCRIPTION OF THE INVENTION

To successfully practice this invention, a detailed knowledge of the intersolubility characteristics of the solute, solvent and dopant for any given system must be obtained. This can be done in accordance with conventional practices which require one to collect sufficient data to develop a temperature-composition phase diagram. This has been done in connection with the silver thiogallate, potassium chloride, and germanium system, which shall be discussed below in greater detail. The method of this invention, however, can be utilized with many different systems, provided that at one temperature range solute will precipitate from the system with trace amounts of dopant incorporated in it and at another temperature range, the solute and dopant will precipitate from the solution as distinct and separate solids. Under these latter conditions the solute, upon crystallization, is substantially free of any dopant. This phenomenon (temperature/compositiondependent phase precipitation) then permits one to selectively form layers of the seed crystal substrate having different resistivities.

Figure 1:
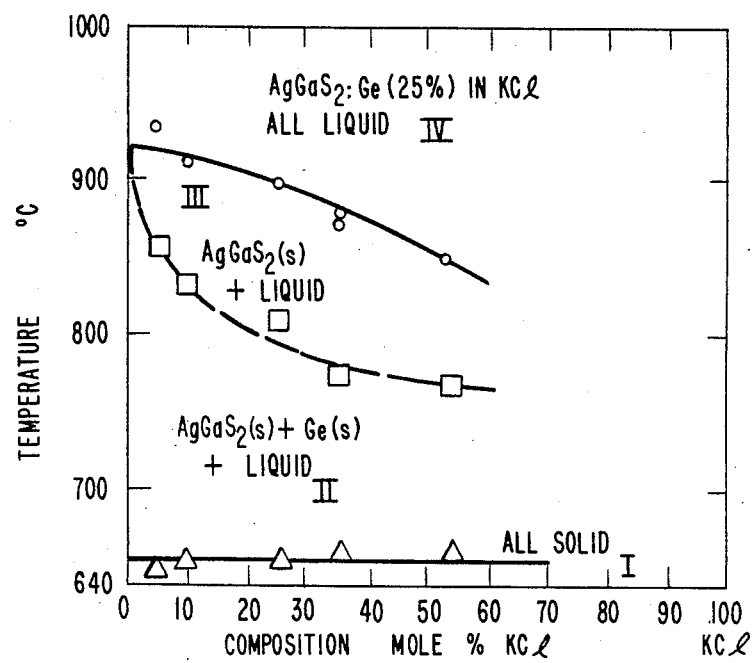
FIG. 1 is a temperature-composition phase diagram for the system germanium:silver thiogallate (25 mole percent)-potassium chloride.

Specifically, a portion of the composition system comprising silver thiogallate/germanium/potassium chloride, as shown in the FIG. 1, has been found to exhibit four distinct regions indicated by the Roman numerals I through IV. In the system, shown in FIG. 1, the silver thiogallate:germanium composition is constant at 25 mole percent germanium in silver thiogallate, and the solvent, potassium chloride, is varied over the range of from 0–60 mole percent. The diagram was experimentally determined by the use of differential thermal analysis.

Region I is all solid material; that is, germanium is solid, the potassium chloride is solid, and the silver thiogallate is solid. In Region II, the silver thiogallate and germanium are solid and the potassium chloride is liquid. Region III is liquid containing solid silver thiogallate. Region IV is all liquid. The constant temperature line separating Regions I and II is at approximately 654° C., the eutectic melting point.

If the seed crystal substrate is dipped into the solution at a temperature in the Region III, silver thiogallate will crystallize on the surface of the substrate and will incorporate atoms of germanium in trace amounts. In contrast, if the seed crystal substrate, either with a previously applied layer or not, is dipped into Region II and allowed to cool slowly over a temperature drop of about 20° C., but still remaining in this Region II, there will form on the substrate a layer of silver thiogallate substantially free of any germanium. This is due to the tendency of Ge to precipitate out as a separate, solid phase.

In accordance with the method of this invention, the germanium-doped layer of silver thiogallate is preferably first formed on the seed crystal substrate. Then the substrate with the germanium-doped layer of silver thiogallate is removed from the solution, which is cooled to a temperature in Region II. Next, the substrate with the germanium-doped silver thiogallate layer on it is reimmersed in the cooler solution in Region II and then the solution is subsequently further cooled. As a result, a second layer essentially pure silver thiogallate forms on the doped layer. This pure silver thiogallate layer will be firmly bonded to the germanium-doped layer and its resistivity will be substantially higher than that of the germanium-doped layer. By repeating these steps, a multi-layered crystalline material is made.

As suggested above, one could also first form on the seed crystal a layer of essentially pure silver thiogallate by starting in the Region II temperature range and, after formation of this pure silver thiogallate layer thereon, into the molten solution at a temperature in Region III and then slowly cool to form the layer including the dopant. Because the seed crystal may already have a layer thereon, the term "seed crystal substrate," as used herein, means a seed crystal either with or without a previously formed doped or undoped layer. In either case, the seed crystal substrate is removed from the solution prior to the reimmersion at the second temperature range.

While the preceding description has been presented in terms of a particular germanium:silver thiogallate ratio of 1:4, other ratios of germanium to silver thiogallate which evidence the temperature/composition-dependent phase precipitation phenomenon may also be employed. Germanium dissolves in silver thiogallate up to about 45 mole % of Ge. Accordingly, such Ge:AgGaS$_2$ solutions may be suitably employed in the invention.

Figure 2:
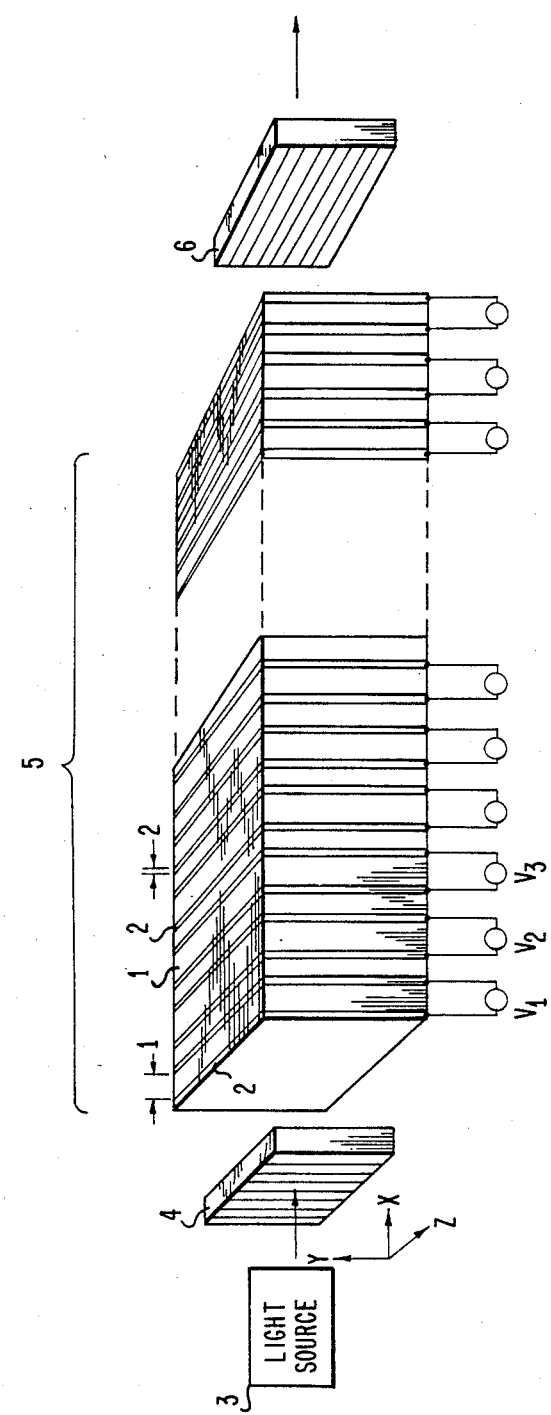
FIG. 2 is a schematic of an electro-optical tunable filter of the type in which the doped and undoped single crystal multilayered structures can be utilized.

The multi-single crystal layered structures comprised of silver thiogallate having alternate high and low resistivity layers, produced in accordance with the invention, are particularly advantageous when used as the birefringent medium in tunable electro-optic filters. FIG. 2 shows a schematic of a typical tunable electro-optic filter wherein the low resistivity layers 2 alternate with the high resistivity layers 1 so that the desired voltage $V_1$, $V_2$, $V_3$, etc. can be passed through the low resistivity layers in order to vary the filter transmission characteristic. An input beam or ray of light from a light source 3 is passed through an input polarizer 4 which establishes a desired linear polarization for the light. The light then passes through the tunable birefringent medium (the multi layered structure 5) and an output polarizer or analyzer 6, which passes light polarized along a direction bearing a preselected angular relationship to the direction of polarization of the light emerging from the input polarizer 4. Such a device is described in more detail in U.S. Pat. No. 4,197,008. The ability to grow layers of AgGaS$_2$ having defined resistivities ranging from one layer to the net is advantageously employed in fabricating a variety of electro-optical devices, such as tunable filters, modulators, switches, shutters, resonators and the like.

The following is a specific example for making a multi-layered crystalline material of this invention.

EXAMPLE I

The silver thiogallate solution from which the epitaxially-grown layers were crystallized was prepared as follows. Nearly 250 grams of high purity silver thiogallate, potassium chloride and germanium were loaded into a quartz crucible. The composition of the mixture was such that the silver thiogallate and germanium combined made up 37.5 mole percent of the mixture and KCl accounted for the other 62.5 mole percent. The mole ratio of germanium to silver thiogallate was 1:4.

The seed crystal of silver thiogallate used as the substrate upon which the layers were grown was prepared by reacting silver gallium alloys with sulfur vapors. Prior to reaction, the molten silver gallium alloys were equilibrated at 745° C. in flowing hydrogen for at least eight hours to provide for reduction of any surface oxides. The reacted silver gallium sulfide polycrystalline compound was then four-pass zone-refined for removal of any small quantities of second phase Ag$_9$GaS$_6$ or Ag$_2$Ga$_{10}$S$_{31}$ precipitates. The BridgmanStockbarger method was used to grow a crystal from this material. This bulk crystal was then cut, machined, and prepared for use as a substrate/seed crystal.

The crucible (containing the silver thiogallate, potassium chloride, and germanium) in its quartz growth chamber was evacuated to approximately 10$^{-6}$ Torr at room temperature and then filled with argon to a pressure of five psi. The chamber was heated, with crucible enclosed, to a temperature of 880° C. and held at this temperature for 12 hours. This permitted the molten solution to equilibrate and reach a homogeneous condition. The molten solution was then slowly cooled to 835° C. at a rate of 1° C. per minute. At 835° C. a clean, single crystal of silver thiogallate, prepared in accordance with the procedure set forth in the Sashital I Application, and described above, was immersed in the molten solution. This crystal was then rotated at five rpm while in the solution. During the rotation of the single crystal of silver thiogallate, the molten solution was further cooled to 820° C. at the rate of 0.05° per minute. This cooling produced a layer of a single crystal of silver thiogallate approximately 16 μm thick on the seed crystal. This layer incorporated within it less than one percent of germanium. At this temperature, the seed crystal with the germanium-doped layer thereon was removed from the solution. It was also removed from the growth chamber, after allowing the entire chamber to cool slowly to room temperature, and then washed with warm water to remove any potassium chloride adhering to its surface.

A second layer was then epitaxially grown upon the seed crystal with the germanium-doped layer thereon. The second layer did not contain germanium, but was a substantially pure silver thiograllate layer. In order to grow the second layer, about 250 grams of a 7.5 mole % silver thiogallate and 92.5 mole % potassium mixture was heated to 890° C. in a quartz crucible, under an argon atmosphere of 1 psi. This molten solution was then maintained at this temperature for 16 hours to allow the ingredients to equilibrate. The solution was then slowly cooled at a rate of 0.5° C./minute to 782° C. At this temperature, the seed crystal with the germanium-doped layer thereon was immersed in the molten solution. Subsequently, cooling was commenced at a rate of 0.056° C. per minute until the solution temperature reached 773° C. Simultaneously, the seed crystal was rotated at a rate of 5 rpm. On reaching 773° C., the seed crystal with two epitaxially grown layers was withdrawn from the growth solution. The two-layer coated crystal/substrate was allowed to cool slowly and then was washed in hot water (80° C.) for five minutes. A second layer having a thickness of nearly 18 μm had been grown.

A third layer approximately 16 μm thick was then epitaxially grown upon the above seeded two-layer structure using the same process described in the first step of this example.

The multi-step process described in this example permits fabrication of a structure in which different layers exhibit different resistivity. The three layer structure produced in this example was a low-resistivity/high-resistivity/low-resistivity structure wherein the low-resistivity layers exhibited a resistivity of about 6×10$^7$ ohm-cm and the high-resistivity layer exhibited a resistivity of about $1 \times 10^{12}$ ohm-cm.

EXAMPLE II

It is also possible to grow both high (pure) and low (Ge doped) layers of silver thiogallate out of the same solution.

With reference to the phase equilibrium diagram in FIG. 1, it should be noted that Region III is $AgGaS_2$ (solid) plus Ge and KCl liquid, whereas region II above the eutectic is $AgGaS_2$ (solid) plus Ge (solid) plus KCl liquid. Therefore, in Region III, when a solution is cooled, $AgGaS_2$ starts to precipitate out as a solid. During this process, the Ge in solution is still liquid and will be dispersed in atomic or molecular form within the liquid solution. In this region, Ge dopant is incorporated in the growing $AgGaS_2$ epilayer. However, in Region II, both $AgGaS_2$ and Ge precipitate separately as pure solids. In Region II, $AgGaS_2$ will grow on the epilayer, but the Ge precipitating out as solid crystallites is excluded by the growing $AgGaS_2$ epilayer.

The process in this example requires growth of the low-resistivity Ge-doped layer of $AgGaS_2$ in Region III and growth of the high-resistivity pure layer of $AgGaS_2$ in Region II.

High purity silver thiogallate, potassium chloride and germanium are loaded into a quartz crucible. The composition of the mixture is such that the silver thiogallate and germanium combined make up 37.5 mole % of the mixture and potassium chloride accounts for the other 62.5 mole %. The mole ratio of germanium to silver thiogallate is 1:4. The first layer, doped silver thiogallate, is grown using the procedure and time-temperature conditions described in Example I above. The second layer, pure silver thiogallate, is grown without the necessity of removing the seed crystal with the germanium-doped layer thereon from the reaction chamber. The above structure is simply lifted to the vapor space above the growth solution and the entire chamber is cooled at a rate of about 1 to 2° C. per minute until the temperature of the molten solution is within Region II. For a 37.5 mole % mixture of germanium and silver thiogallate, this temperature is about 770° C. At this temperature, the seed crystal with the germanium-doped silver thiogallate layer thereon is reimmersed in the molten solution which is then allowed to cool at a rate of 0.05° C. per minute. A layer of essentially pure silver thiogallate is grown on the germanium-doped layer. On reaching about 750° C., the seed crystal with the multiple layers of doped and undoped silver thiogallate is removed from the growth solution. The thickness of the germanium-doped layer is between 25 and 30 μm, and the thickness of the essentially pure silver thiogallate layer is between 15 and 20 μm.

The foregoing process is repeated as many times as needed to form a composite of alternating low and high resistivity layers.

The description in Example I presents the best mode contemplated for carrying out the multiple growth solutions form of the invention. The description in Example II presents a method of carrying out a single growth solution form of the invention. The tunable electro-optic filter described above with reference to FIG. 2 is capable of utilizing the multi-layered structure produced by the methods above. These forms of invention are, however, susceptible to modifications and alternate constructions from the embodiments shown in the drawing and described above. Consequently, it is not the intention to limit the forms of the invention to the particular embodiments disclosed. On the contrary, the intention is to cover all modifications alternate constructions falling within the spirit and scope of the invention as expressed in the appended claims.

What is claimed is:

1. A multi-layer electro-optical crystalline material comprising a plurality of adjacent, single crystal layers wherein each crystal layer has different electrical and optical properties from its adjacent layer or layers, said layers epitaxially grown from a molten solution including said electro-optical crystalline material and at least one dopant, with adjacent ones of said layers differing in composition from essentially pure said electro-optical crystalline material to said electro-optical crystalline material containing substantial amounts of said at least one dopant.

2. The material of claim 1 wherein said layers have resistivities ranging from about $10^5$ ohm-centimeters to $10^{14}$ ohm-centimeters.

3. The material of claim 2 wherein the high resistivity layers comprise silver thiogallate and those layers having the lower resisitivity comprise silver thiogallate containing a dopant consisting essentially of germanium.

4. The material of claim 1 wherein said adjacent layers alternate between a high-resistivity layer with a resistivity ranging from about $10^{12}$ to $10^{14}$ ohm-centimeters and a low-resistivity layer with a resistivity ranging from about $10^5$ to $10^9$ ohm-centimeters.

5. The material of claim 4 wherein the high resistivity layers comprise silver thiogallate and those having the lower resistivity comprise silver thiogallate containing a dopant consisting essentially of germanium.

6. The material of claim 1 formed by epitaxially growing successive layers on a substrate from a molten solution of silver thiogallate in a solvent including said at least one dopant, wherein the substrate is cooled throughout at least two different temperature ranges, one temperature range forming a layer of essentially pure silver thiogallate, and the other temperature range forming a layer of silver thiogallate including said at least one dopant.

7. The material of claim 6 wherein the essentially pure silver thiogallate layer has a resistivity in the range of from about $10^{12}$ to $10^{14}$ ohm-centimeters and the silver thiogallate layer containing dopant has a resistivity in the range of from about $10^5$ to $10^9$ ohm-centimeters.

8. The material of claim 7 wherein said dopant-containing layer contains germanium.

9. A method of making an electrooptical material having a plurality of adjacent, single crystals wherein each crystal has different electrical and optical properties from its adjacent layer or layers comprising the steps of:
   (a) providing a molten solution of electrooptical material dissolved in a solvent including at least one dopant, said solution exhibiting the property that on cooling within a first temperature range the electro-optic material forms a single crystal essentially free of said at least one dopant, and on cooling within at least one additional temperature range the electrooptic material forms a single crystal including said at least one dopant;
   (b) placing in said molten solution at one temperature range a seed crystal substrate and cooling said solution, while maintaining the temperature of the solution within said one temperature range, to thereby form on the seed crystal substrate a first layer of said single crystal electro-optic material; and (c) adjusting the temperature of said solution so that it is within another temperature range and immersing said seed crystal substrate with said first layer thereon and slowly cooling said solution within the additional temperature range to form a second layer of a single crystal material of different electrical and optical properties.

10. The method of claim 9 wherein the seed crystal substrate with the first layer thereon is first removed from the solution and then the solution is cooled to the second temperature range and the seed crystal substrate with the first layer thereon is reimmersed in the solution.

11. The method of claim 10 wherein the solution comprises a mixture of silver thiogallate, potassium chloride and the dopant.

12. The method of claim 11 wherein the dopant consists essentially of germanium.

13. The method of claim 12 wherein said layers have resistivities from about $10^5$ to $10^{14}$ ohm-centimeters.

14. The method of claim 13 wherein said adjacent layers alternate between a high resistivity layer with a resistivity ranging from about $10^{12}$ to $10^{14}$ ohm-centimeters and a low resistivity layer with a resistivity ranging from about $10^5$ to $10^9$ ohm-centimeters.

15. The method of claim 9 wherein said seed crystal substrate is rotated slowly during formation of the layer.

16. The method of claim 9 wherein steps (b) and (c) are repeated to form additional layers of alternating resistivities.

17. A method of making an electro-optical material having plurality of adjacent, single crystal layers wherein each crystal layer has different electrical and optical properties from its adjacent layer or layers comprising the steps of:

(a) providing a molten solution of electrooptical material dissolved in the solvent including at least one dopant, said solution exhibiting the property that on cooling within a specified temperature range, the electro-optical material forms a single crystal essentially free of said at least one dopant and on cooling within at least one additional temperature range, the electro-optical material forms a single crystal including said at least one dopant;

(b) placing in said molten solution a seed crystal substrate and cooling said solution to thereby form on said seed crystal substrate a layer of single crystal electro-optical material including said at least one dopant;

(c) subsequent to the formation of said single crystal layer, cleaning off any residual solution material by washing said seed crystal with epitaxially grown electro-optical material layer thereon in a solvent capable of dissolving said solution material;

(d) subsequent to the removal of said molten solution material, providing a different solution of electrooptical material dissolved in a solvent including said at least one dopant, said solution exhibiting the property that on cooling within a specified temperature range, said electro-optical material forms a single crystal optionally including said at least one dopant;

(e) placing in said molten solution said seed crystal substrate having at least one epitaxially grown layer thereon to thereby form on said epitaxially grown layer a subsequent layer of single crystal material having different electrical and optical properties from that of the preceeding layer;

(f) subsequent to the formation of said single crystal layer, cleaning off any residual solution material by washing said seed crystal with epitaxially grown electro-optical material layer thereon in a solvent capable of dissolving said solution material; and (g) repeating steps (d) through (f) as necessary in order to produce an electro-optical layered material with the electrical and optical properties desired.

18. The method of claim 17 wherein said molten solution comprises a mixture of silver thiogallate, potassium chloride and optionally at least one dopant.

19. The method of claim 18 wherein said dopant consists essentially of germanium.

20. The method of claim 19 wherein said layers have resistivities from about $10^5$ to $10^{14}$ ohm-centimeters.

21. The method of claim 20 wherein said adjacent layers alternate between a high resistivity layer with a resistivity ranging from about $10^{12}$ to $10^{14}$ ohm-centimeters and a low resistivity layer with a resistivity ranging from about $10^5$ to $10^9$ ohm-centimeters.

22. The method of claim 17 wherein said seed crystal substrate is rotated slowly during formation of the first layer and during the formation of subsequent layers.

23. An optical filter comprising first and second polarizers spaced from one another along a predetermined path and having their respective pass directions for polarized light oriented at a desired angular relationship with respect to one another;

a birefringent electro-optic crystal medium disposed along said path between said first and second polarizers and oriented with the optic axis of said medium perpendicular to said means for directing a beam of light including a plurality of wavelengths through said first polarizer and said medium along said path; and means for applying to successive regions of said medium along said path a dc electric field to produce birefringence in said successive regions of the optic axis thereof about the pass direction of said first polarizer in a plane perpendicular to said path as a function of distance along said path with a predetermined spatial variation such that at least one of said wavelengths in said beam is passed by said second polarizer and at least another of said wavelengths is rejected by said second polarizer, characterized in that said birefringent electro-optic crystal medium comprises a multilayered structure comprising epitaxially grown layers of silver thiogallate, with or without a dopant, wherein such layers are alternatively high resistivity and low resistivity layers, depending on the dopant level.

24. The device of claim 23 wherein the resistivity of the high resistivity layer ranges from about $10^{12}$ to about $10^{14}$ ohm-centimeters and the resistivity of the low resistivity layer ranges from about $10^5$ to about $10^9$ ohm-centimeters.

* * * * *